(12) United States Patent
Lee et al.

(10) Patent No.: US 7,651,790 B2
(45) Date of Patent: Jan. 26, 2010

(54) ORGANIC LIGHT-EMITTING DEVICE

(75) Inventors: Jun-Yeob Lee, Suwon-si (KR);
Jang-Hyuk Kwon, Suwon-si (KR);
Min-Seung Chun, Suwon-si (KR);
Yong-Joong Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 399 days.

(21) Appl. No.: 11/266,248

(22) Filed: Nov. 4, 2005

(65) Prior Publication Data

US 2006/0263631 A1 Nov. 23, 2006

(30) Foreign Application Priority Data

Nov. 5, 2004 (KR) .................. 10-2004-0089652

(51) Int. Cl.
*H01L 51/54* (2006.01)
*C09K 11/06* (2006.01)

(52) U.S. Cl. .................. 428/690; 428/917; 313/504; 313/506; 548/440; 252/301.16

(58) Field of Classification Search ........... 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS 5,141,671 A * 8/1992 Bryan et al. ........... 252/301.16
6,225,467 B1 * 5/2001 Esteghamatian et al. .... 544/180
6,242,115 B1 * 6/2001 Thomson et al. ............ 428/690
6,406,804 B1 * 6/2002 Higashi et al. .............. 428/690
6,451,455 B1 * 9/2002 Thompson et al. .......... 428/690
2004/0086745 A1 * 5/2004 Iwakuma et al. ............ 428/690
2005/0127826 A1 * 6/2005 Qiu et al. .................... 313/504

FOREIGN PATENT DOCUMENTS

| JP | 2001520450 | 10/2001 |
| JP | 2003109767 | 4/2003 |
| JP | 2003229277 | 8/2003 |
| JP | 2004-185967 | * 2/2004 |
| JP | 2007230867 | 9/2007 |
| WO | WO 0141512 | * 6/2001 |
| WO | WO 2004048083 | 6/2004 |
| WO | WO 2004066685 | 8/2004 |

OTHER PUBLICATIONS

Machine Translation of JP 2004-185967. (Feb. 2004).*

* cited by examiner

*Primary Examiner*—Dawn Garrett
(74) *Attorney, Agent, or Firm*—H.C. Park & Associates, PLC

(57) ABSTRACT

An organic light-emitting device is provided that includes an emission layer containing a phosphorescent dopant and a bipolar phosphorescent host interposed between a first electrode and a second electrode. The bipolar phosphorescent host is a compound represented by formula 1:

$$A-C-B \quad (1)$$

where A is a hole transport unit, B is an electron transport unit, and C is a bond or a linking group. The bipolar compound can transport both holes and electrons. The organic light-emitting device has high efficiency and a long lifetime.

12 Claims, 1 Drawing Sheet

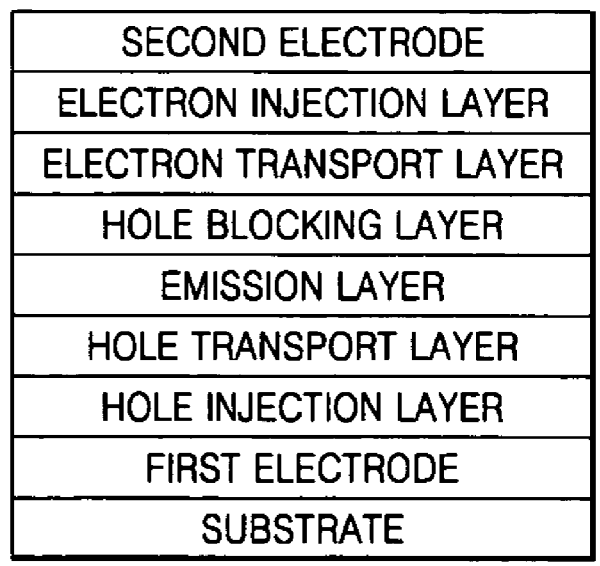

FIG. 1A

| SECOND ELECTRODE |
|---|
| ELECTRON TRANSPORT LAYER |
| EMISSION LAYER |
| HOLE TRANSPORT LAYER |
| FIRST ELECTRODE |
| SUBSTRATE |

FIG. 1B

| SECOND ELECTRODE |
|---|
| ELECTRON INJECTION LAYER |
| ELECTRON TRANSPORT LAYER |
| EMISSION LAYER |
| HOLE TRANSPORT LAYER |
| HOLE INJECTION LAYER |
| FIRST ELECTRODE |
| SUBSTRATE |

FIG. 1C

| SECOND ELECTRODE |
|---|
| ELECTRON INJECTION LAYER |
| ELECTRON TRANSPORT LAYER |
| HOLE BLOCKING LAYER |
| EMISSION LAYER |
| HOLE TRANSPORT LAYER |
| HOLE INJECTION LAYER |
| FIRST ELECTRODE |
| SUBSTRATE |

ORGANIC LIGHT-EMITTING DEVICE

CROSS-REFERENCE TO RELATED PATENT APPLICATIONS

This application claims priority to and the benefit of Korean Patent Application No. 10-2004-0089652, filed on Nov. 5, 2004, which is hereby incorporated by reference for all purposes as if fully set forth herein.

BACKGROUND OF THE INVENTION

1. Field of the Invention

The present invention relates to an organic light-emitting device that uses a bipolar compound in the emission layer to achieve improved efficiency and a long lifetime.

2. Discussion of the Background

Emission materials for organic electroluminescent devices are divided into fluorescent materials using a singlet exciton and phosphorescent materials using a triplet exciton according to the emission mechanism.

In general, phosphorescent materials are organic metal compounds containing heavy atoms. When phosphorescent materials are used, triplet-state excitons, which are forbidden transition, may produce phosphorescent emission. Phosphorescent materials have higher emission efficiency than fluorescent materials because phosphorescent materials use 75% triplet-state excitons while fluorescent materials use 25% singlet-state excitons.

An emission layer composed of a phosphorescent material includes a host material and a dopant material. The dopant material emits light by receiving energy from the host material. Examples of dopant materials include iridium metal compounds, such as $(4,6-F_2\ ppy)_2Irpic$ or an Ir compound based on a ppy(fluorinated ppy) ligand structure developed by Princeton University and South California University. CBP (4,4'-N,N'-dicarbazole-biphenyl) have been widely used as host material for these iridium compounds. A triplet state of CBP has an energy band gap that is sufficient for energy transition for green and red materials. However, CBP has a smaller energy band gap than blue materials which causes an ineffective heat-absorbing transition to occur. The energy transition from the CBP host to blue dopant is not sufficient, blue emission efficiency is low, and the lifetime of the device is short.

SUMMARY OF THE INVENTION

The present invention provides an organic light-emitting device with high efficiency and a long lifetime. An emission layer is formed in the organic light emitting device using a bipolar compound having a hole transport unit and an electron transport unit as a phosphorescent host. Effects similar to an organic light-emitting device manufactured using a mixture of a hole transport material and an electron transport material are thus obtained.

The present invention discloses an organic light-emitting device which includes an emission layer containing a phosphorescent dopant interposed between a first electrode and a second electrode, wherein the emission layer includes a bipolar compound as a phosphorescent host represented by formula 1:

A—C—B        (1)

where A is a hole transport unit, B is an electron transport unit, and C is a bond or a linking group.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 1A, FIG. 1B and FIG. 1C illustrate various structures of organic light-emitting devices.

DETAILED DESCRIPTION OF THE ILLUSTRATED EMBODIMENTS

In an organic light-emitting device according to an exemplary embodiment of the present invention, an emission layer contains a phosphorescent dopant and a host material. The host material contains a hole transport unit A, an electron transport unit B, and a bond or a linking group C. The organic light-emitting device including the emission layer has high efficiency and a long lifetime.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

According to an exemplary embodiment of the present invention, in formula 1, A may be a hole transport unit, B may be an electron transport unit, and C may be a bond, or a linking group such as, but is not limited to, oxygen atom (O), sulfur atom (S) or NH. Specifying unit C as "a bond" implies that the unit A is directly linked with the unit B. Specifying unit C as "a linking group" implies that unit A is linked with unit C and unit C is linked with unit B.

The hole transport unit A may be a carbazole unit represented by one of the following formulae:

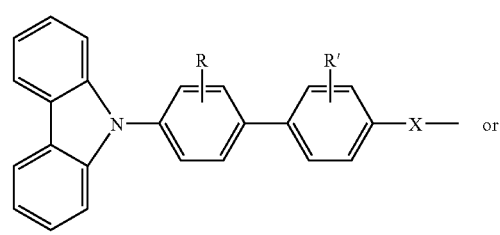

-continued

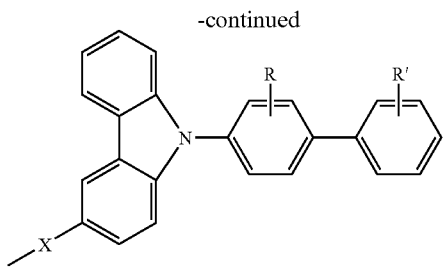

R and R' each may be independently selected from H, a $C_1$-$C_{22}$ alkyl group, an alkoxy group, a CN group, a $NO_2$ group, and a —O—Ar group where Ar may be phenyl, biphenyl, 1-naphthyl, or 2-naphthyl; and X may be O, $CR_2$, NR, S, or N=N.

The carbazole unit may include but is not limited to at least a compound selected from 1,3,5-tricarbazolylbenzene, 4,4'-biscarbazolylbiphenyl(CBP), polyvinylcarbazole, m-biscarbazolylphenyl, 4,4'-biscarbazolyl-2,2'-dimethylbiphenyl (dmCBP), 4,4',4''-tri(N-carbazolyl)triphenylamine, 1,3,5-tri (2-carbazolylphenyl)benzene, 1,3,5-tris(2-carbazolyl-5-methoxyphenyl)benzene, and bis(4-carbazolylphenyl)silane.

The electron transport unit B may include, but is not limited to, a fluorine unit, a triazine unit, a spirofluorene unit, an aluminum hydroquinoline unit or a phenanthroline unit.

The fluorene unit may be represented by

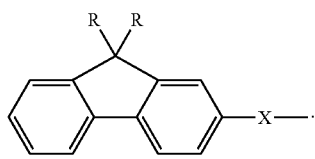

R may be selected from H, $C_1$-$C_{22}$ alkyl group, an alkoxy group, a CN group, a $NO_2$ group, and a —O—Ar group where Ar may be phenyl, biphenyl, 1-naphthyl, or 2-naphthyl; and X may be O, $CR_2$, NR, S, or N=N.

The fluorene unit may include, but is not limited to, at least a material selected from fluorene, dimethylfluorene, diphenylfluorene, diethylfluorene, and the like.

The triazine unit may be represented by

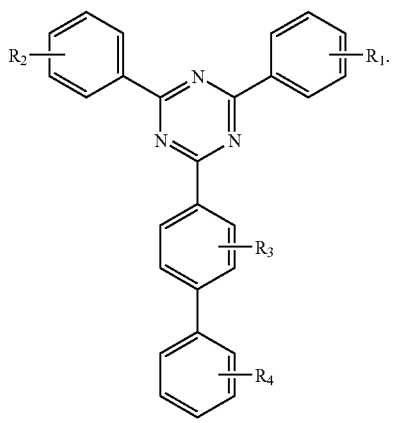

$R_1$, $R_2$, $R_3$, and $R_4$ each may be independently selected from H, a $C_1$-$C_{22}$ alkyl group, an alkoxy group, a CN group, a $NO_2$ group, and a —O—Ar group where Ar may be phenyl, biphenyl, 1-naphthyl, or 2-naphthyl.

The triazine unit may be selected from, but is not limited to, phenyltriazine, biphenyltriazine, 2,4,6-tris(diarylamino)-1,3,5-triazine, 2,4,6-tris(diphenylamino)-1,3,5-triazine, 2,4,6-tricarbazolo-1,3,5-triazine, 2,4,6-tris(N-phenyl-2-naphthylamino)-1,3,5-triazine, 2,4,6-tris(N-phenyl-1-naphthylamino)-1,3,5-triazine, and 2,4,6-trisbiphenyl-1,3,5-triazine, and the like.

The spirofluorene unit may be represented by

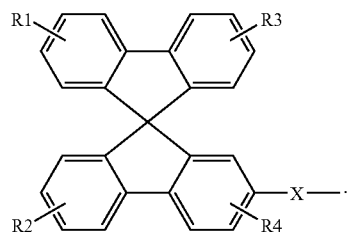

$R_1$, $R_2$, $R_3$, and $R_4$ each may be independently selected from H, a $C_1$-$C_{22}$ alkyl group, an alkoxy group, a CN group, a $NO_2$ group, and a —O—Ar group where Ar may be phenyl, biphenyl, 1-naphthyl, or 2-naphthyl; and X may be O, $CR_2$, NR, S, or N=N.

The spirofluorene unit may include, but is not limited to at least a material selected from phenylspirofluorene, biphenylspirofluorene, methylspirofluorene, and the like.

The aluminum hydroquinoline unit may be represented by

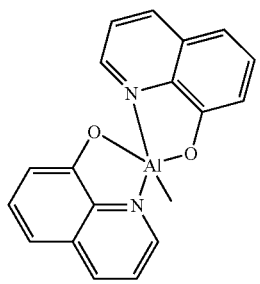

R and R' each may be independently selected from H, a $C_1$-$C_{22}$ alkyl group, an alkoxy group, a CN group, a $NO_2$ group, and a —O—Ar group where Ar may be phenyl, biphenyl, 1-naphthyl, or 2-naphthyl; and X may be O, $CR_2$, NR, S, or N=N.

The phenanthroline unit may be represented by

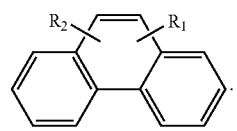

$R_1$ and $R_2$ each may be independently selected from H, a $C_1$-$C_{22}$ alkyl group, an alkoxy group, a CN group, a $NO_2$ group, and a —O—Ar group where Ar may be phenyl, biphenyl, 1-naphthyl, or 2-naphthyl.

The phenanthroline unit may include, but is not limited to, at least a material selected from phenanthroline, dimethylphenanthroline, diphenylphenanthroline, and the like.

Unit A and unit B may have different highest occupied molecular orbital (HOMO) energy levels, different lowest unoccupied molecular orbital (LUMO) energy levels, or both different HOMO energy levels and different LUMO energy levels.

When unit A and unit B have different energy levels, the injected holes and injected electrons can move along stable energy levels, and are easily recombined in the emission layer. Far fewer electric charges escape from the emission layer. These effects cannot be obtained when the unit A and the unit B have same energy levels. Accordingly, when at least one of the HOMO energy levels and the LUMO energy levels of unit A and unit B are different from each other, electric charges can move along a stable energy level. Unit A and unit B make up the bipolar material that is used as the phosphorescent host of the emission layer. Each of unit A and unit B may have a triple energy level of 2.0 eV or higher. When the triple energy level is less than 2.0 eV, the energy transition cannot be completed.

The amount of the biopolar compound used as the phosphorescent host in the emission layer may be in the range of about 70 to about 99 parts by weight based on 100 parts by weight of the host and the dopant. When the amount of the phosphorescent host is less than about 70 parts by weight, the triplet is quenched, which decreases the efficiency of the device. When the amount of the phosphorescent host is greater than about 99 parts by weight, the amount of the emission material is not sufficient, and the efficiency and lifetime of the device decreases.

The phosphorescent dopant for the emission layer is an emission material. The phosphorescent dopant may be, but is not limited to, bisthienylpyridine acetylacetonate Iridium, bis(benzothienylpyridine)acetylacetonate Iridium, bis(2-phenylbenzothiazole)acetylacetonate Iridium, bis(1-phenylisoquinoline)Iridium acetylacetonate, tris(1-phenylisoquinoline)Iridium, tris(phenylpyridine)Iridium, tris(2-phenylpyridine)Iridium, tris(3-biphenylpyridine)Iridium, tris(4-biphenylpyridine)Iridium, or the like.

According to an exemplary embodiment of the present invention, at least one of a hole injection layer and a hole transport layer may be interposed between a first electrode and the emission layer, and at least one of a hole blocking layer, an electron transport layer, and an electron injection layer may be interposed between the emission layer and a second electrode.

According to an exemplary embodiment of the present invention, unit A may contain 4,4'-biscarbazolylphenyl and unit B may contain aluminum hydroquinoline in the bipolar compound that is used as the phosphorescent host for the emission layer. The bipolar compound may be represented by

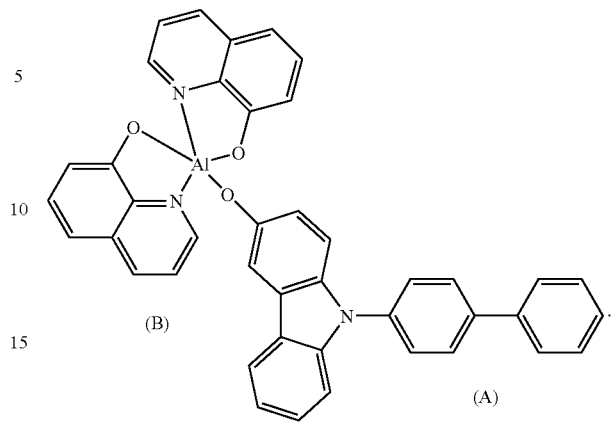

The phosphorescent dopant of the emission layer may be $Ir(ppy)_3$, and may be present in the amount of about 1 to about 30 parts by weight based on 100 parts by weight of the phosphorescent host. The bipolar compound may be produced by linking unit A and unit B.

A method of making an organic light-emitting device according to an exemplary embodiment of the present invention will now be described in detail.

FIG. 1A, FIG. 1B and FIG. 1C are sectional views of organic light-emitting devices according to exemplary embodiments of the present invention.

Referring to FIG. 1A, the organic light-emitting device includes a first electrode, a hole transport layer, an emission layer, an electron transport layer, and a second electrode which are deposited sequentially.

The organic light-emitting device shown in FIG. 1B is different from the organic light-emitting device shown in FIG. 1A in that a hole injection layer is formed between the first electrode and the hole transport layer and an electron injection layer is formed between the electron transport layer and the second electrode.

The organic light-emitting device shown in FIG. 1C is different from the organic light-emitting device shown in FIG. 1B in that a hole blocking layer is formed between the emission layer and the electron transport layer.

To produce an organic light-emitting device, an anode forming material may be coated on a substrate to form an anode that functions as a first electrode. The substrate may be a substrate used in a conventional organic light-emitting device, such as glass or plastic. The substrate should be transparent, water proof, have a smooth surface, and be easily treated. The anode forming material may be a transparent and highly conductive metal, such as Indium Tin Oxide (ITO), Indium Zinc Oxide (IZO), tindioxide ($SnO_2$), zinc oxide (ZnO), or the like.

A hole injection layer (HIL) may be vacuum thermally deposited or spin coated on the anode. The HIL may be about 50 Å to about 1500 Å thick. When the HIL is less than about 50 Å thick, the hole injecting ability deteriorates. When the HIL is more than about 1500 Å thick, the driving voltage of the device increases.

The HIL may be made of, but is not limited to, copper phthalocyanine (CuPc), TCTA, m-MTDATA, IDE406 (which are starburst-type amines available from Idemitsu Co.), or the like.

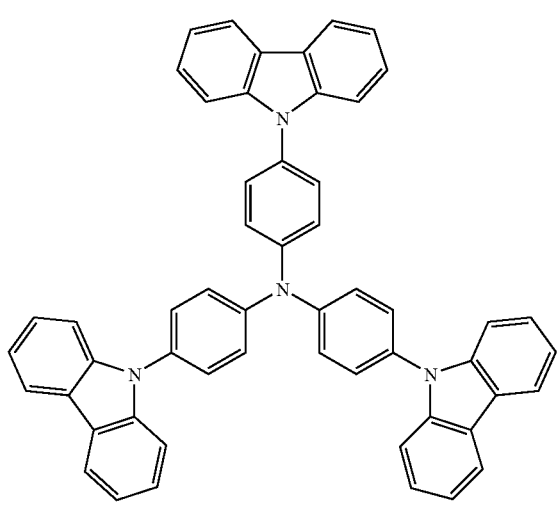

TCTA

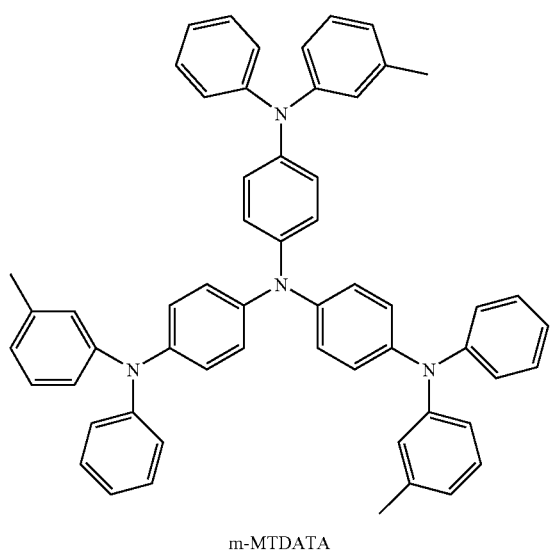

m-MTDATA

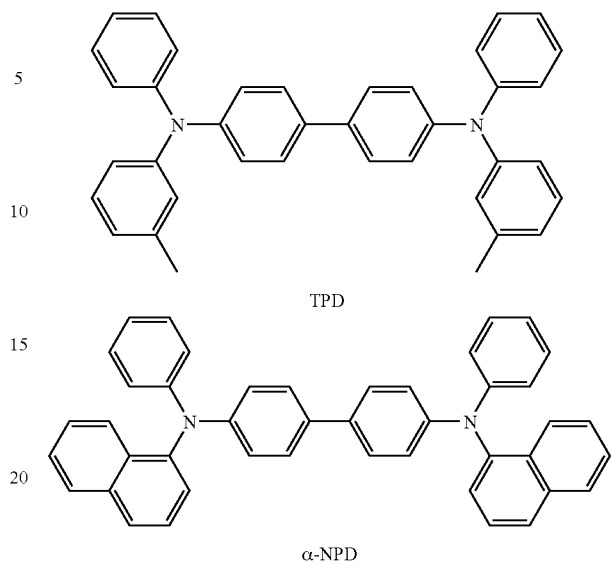

TPD

α-NPD

The emission layer (EML) may be formed on the HTL. The EML may include a phosphorescent host and a phosphorescent dopant. The bipolar compound according to an exemplary embodiment of the present invention may be used as the phosphorescent host. The method of forming the EML may be, but is not limited to, vacuum deposition, inkjet printing, laser transfer, photolithography or the like.

The EML may be about 100 Å to about 800 Å thick, and preferably, about 300 Å to about 400 Å thick. When the EML is less than about 100 Å thick, the efficiency and lifetime of the device decreases. When the EML is more than about 800 Å thick, the driving voltage of the device increases.

A hole blocking layer (HBL) may be vacuum deposited or spin coated on the EML layer to selectively form the layer. The HBL may be made of a material that transports electrons and has an ionized potential higher than the emission compound. For example, the HBL may be made of, but is not limited to, Balq, BCP, TPBI or the like.

The HBL may be in the range of about 30 Å to about 500 Å thick. When the HBL is less than about 30 Å thick, holes cannot be effectively blocked and the efficiency of the device decreases. When the HBL is more than about 500 Å thick, the driving voltage of the device increases.

A hole transport layer (HTL) may be vacuum thermally deposited or spin coated on the HIL to selectively form the layer. The HTL may be made of, but is not limited to, N,N'-bis(3-methylphenyl)-N,N'-diphenyl-[1,1-biphenyl]-4,4'-diamine (TPD); N,N'-diphenyl-N,N'-bis(1-naphthyl)-(1,1'-biphenyl)-4,4'-diamine (NPB); N,N'-di(naphtalene-1-yl)-N,N'-diphenyl-benzidine (α-NPD); IDE320 (obtained from Idemitsu Co.), or the like. The HTL may be in the range of about 50 Å to about 1500 Å thick. When the HTL is less than about 50 Å thick, the hole transporting ability deteriorates. When the HTL is more than about 1500 Å thick, the driving voltage of the device increases.

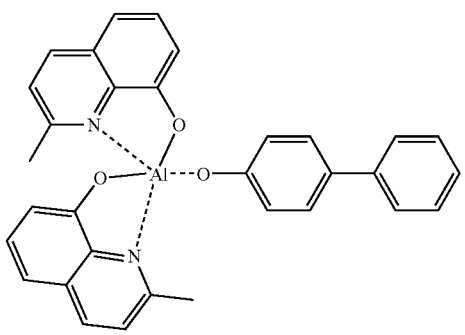

Balq

-continued

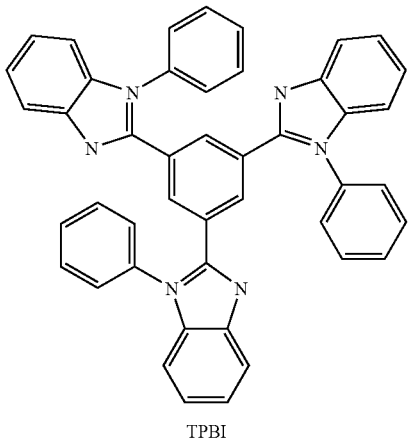

TPBI

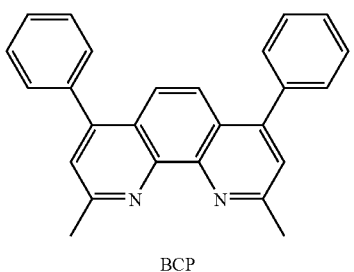

BCP

An electron transport layer (ETL) may be vacuum deposited or spin coated on the HBL. The ETL may be made of, but is not limited to, Alq3. The ETL may be in the range of about 50 Å to about 600 Å thick. When the ETL is less than about 50 Å thick, the lifetime of the device decreases. When the ETL is more than about 600 Å thick, the driving voltage of the device increases.

An electron injection layer (EIL) may be formed on the ETL. The EIL may be made of, but is not limited to, LiF, NaCl, CsF, $Li_2O$, BaO, Liq or the like. The EIL may be in the range of about 1 Å to about 100 Å thick. When the EIL is less than about 1 Å thick, its electron injecting ability decreases and causes the driving voltage of the device to increase. When the EIL is more than about 100 Å thick, the EIL acts as an insulator, thus increasing the driving voltage of the device.

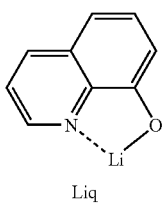

Liq

Metal may be vacuum thermally deposited on the EIL to forming a cathode that functions as the second electrode. The cathode may be made of, but is not limited to, Li, Mg, Al, Al—Li, Ca, Mg—In, Mg—Ag or the like. This step may complete the manufacturing process for the organic light-emitting device.

The organic light-emitting device according to an exemplary embodiment of the present invention may include an anode, an HIL, an HTL, an EML, an HBL, an ETL, an EIL, a cathode, and may further include one or two intermediate layers and an electron blocking layer.

The present invention will be described in further detail with reference to the following examples. These examples are for illustrative purposes only and are not intended to limit the scope of the present invention.

Manufacture of Bipolar Material

Recrystallization of 0.01 mol of 2-methyl-8-quinolinol was performed in a solution mixture of ethanol and water, and then mixed with 0.005 mole of aluminum isopropoxide in an anhydrous diethylether for 30 minutes. The reaction product was filtered. Separately, 0.01 mole of hydroxycarbazolebiphenyl was added to diethylether, heated for 6 hours, and then cooled to precipitate. The resulting solid material was washed and dried to form the bipolar compound according to an exemplary embodiment of the present invention.

Example 1

An ITO glass substrate 15 Ω/$cm^2$ (1200 Å) (obtained from Corning Inc.) was cut to a size of 50 mm×50 mm×0.7 mm. The resultant glass substrate was cleaned using ultrasonic waves in isopropyl alcohol for 5 minutes, then cleaned using ultrasonic waves in pure water for 5 minutes and then cleaned using UV and ozone for 30 minutes to prepare an anode.

N,N'-di(1-naphthyl)-N,N'-diphenylbenzidine (NPD) was vacuum deposited on the anode to form an HTL with a thickness of about 600 Å.

The phosphorescent host, which included 90 parts by weight of the bipolar compound, and the phosphorescent dopant, which included 10 parts by weight of tris (2-phenylpyridine)Iridium, were vacuum deposited on the HTL to form an EML with a thickness of about 400 Å.

Alq3 was deposited on the EML as an electron transporting material to form an ETL with a thickness of about 300 Å.

LiF was vacuum deposited on the ETL to form an EIL with a thickness of about 10 Å. Al was deposited on the EIL to form a cathode with a thickness of about 1000 Å to form an LiF/Al electrode. Thus, the organic light-emitting device illustrated in FIG. 1A was manufactured.

Comparative Example 1

An ITO glass substrate 15 Ω/$cm^2$ (1200 Å) (obtained from Corning Inc.) was cut to a size of 50 mm×50 mm×0.7 mm. The resultant glass substrate was cleaned using ultrasonic waves in isopropyl alcohol for 5 minutes, then cleaned using ultrasonic waves in pure water for 5 minutes and then cleaned using UV and ozone for 30 minutes to prepare an anode.

N,N'-di(1-naphthyl)-N,N'-diphenylbenzidine (NPD) was vacuum deposited on the anode to form a HTL with a thickness of about 600 Å. 90 parts by weight of 4,4'-biscarbazolylbiphenyl as the phosphorescent host and 10 parts by weight of tris (2-phenylpyridine)Iridium as the phosphorescent dopant were vacuum deposited on the HTL to form an EML with a thickness of about 400 Å.

Alq3 was deposited on the EML as an electron transporting material to form an ETL with a thickness of about 300 Å.

LiF was vacuum deposited on the ETL to form an EIL with a thickness of about 10 Å. Al was deposited on the EIL to form a cathode with a thickness of about 1000 Å to form an LiF/Al electrode. Thus, the organic light-emitting device illustrated in FIG. 1A was manufactured.

The efficiency and lifetime of the organic light-emitting devices of Example 1 and Comparative Example 1 were measured.

The organic light-emitting device of Comparative Example 1 had an efficiency of about 24 cd/A, and the organic light-emitting device of Example 1 had an efficiency of about 31 cd/A. The organic light-emitting device of Example 1 had a higher efficiency than the organic light-emitting device of Comparative Example 1. The lifetime of the organic electroluminescent device is defined as the time taken for emission brightness to decrease to half of its initial value. The organic light-emitting device of Example 1 had half of the emission brightness at 1000 cd/m$^2$ after 7,000 hours, and the organic light-emitting device of Comparative Example 1 had half of the emission brightness at 1000 cd/m$^2$ after 5,000 hours. The organic light-emitting device of Example 1 had a longer lifetime than the organic light-emitting device of Comparative Example 1.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting device, comprising:
   an emission layer comprising a bipolar phosphorescent host and a phosphorescent dopant interposed between a first electrode and a second electrode,
   wherein the bipolar phosphorescent host is represented by formula 1:

A—C—B  (1)

where A is a hole transport unit, B is an electron transport unit, and C is a bond or a linking group,
   wherein the hole transport unit A is

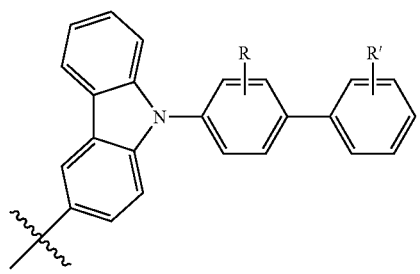

where each of R and R' is selected from a group consisting of H, a $C_1$-$C_{22}$ alkyl group, an alkoxy group, a CN group, a $NO_2$ group, and a —O—Ar group where Ar is selected from a group consisting of phenyl, biphenyl, 1-naphthyl, and 2-naphthyl; and X is selected from a group consisting of O, C—(R)$_2$, NR, S, and N=N, and
   wherein the electron transport unit B is selected from the group of a fluorene unit, a spirofluorene unit, and an aluminum hydroquinoline unit represented by

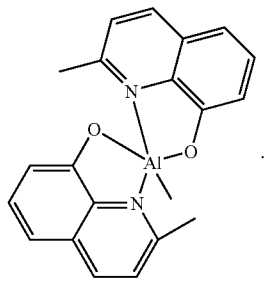

2. The organic light-emitting device of claim 1, wherein the fluorene unit is represented by the following formula:

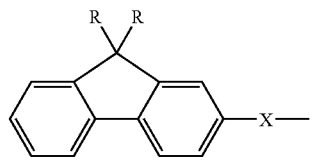

where R is selected from a group consisting of H, $C_1$-$C_{22}$ alkyl group, an alkoxy group, a CN group, a $NO_2$ group, and a —O—Ar group where Ar is selected from a group consisting of phenyl, biphenyl, 1-naphthyl, and 2-naphthyl; and X is selected from a group consisting of O, C—(R)$_2$, NR, S, and N=N.

3. The organic light-emitting device of claim 1, wherein the spirofluorene unit is represented by

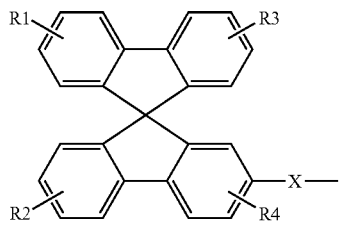

where each of $R_1$, $R_2$, $R_3$, and $R_4$ is selected from a group consisting of H, a $C_1$-$C_{22}$ alkyl group, an alkoxy group, a CN group, a $NO_2$ group, and a —O—Ar group where Ar is selected from a group consisting of phenyl, biphenyl, 1-naphthyl, and 2-naphthyl; and X is selected from a group consisting of O, C—(R)$_2$, NR, S, and N=N.

4. The organic light-emitting device of claim 1, wherein unit C is a bond, or a linking group selected from the group consisting of oxygen atom, sulfur atom, and NH.

5. The organic light-emitting device of claim 1,
wherein the bipolar phosphorescent host in the emission layer is present in an amount in the range of about 70 to about 99 parts by weight based on 100 parts by weight of the bipolar phosphorescent host and the phosphorescent dopant.
6. The organic light-emitting device of claim 1,
wherein the triplet energy levels of both unit A and unit B are 2.0 eV or greater.
7. The organic light-emitting device of claim 1,
wherein the phosphorescent dopant of the emission layer comprises a compound selected from the group of bisthienylpyridine acetylacetonate Iridium, bis(benzothienylpyridine)acetylacetonate Iridium, bis(2-phenylbenzothiazole)acetylacetonate Iridium, bis(1-phenylisoquinoline)Iridium acetylacetonate, tris(1-phenylisoquinoline)Iridium, tris(phenylpyridine) Iridium, tris(2-phenylpyridine)Iridium, tris(3-biphenylpyridine)Iridium, and tris(4-biphenylpyridine) Iridium.
8. The organic light-emitting device of claim 1,
wherein at least one of a hole injection layer and a hole transport layer is interposed between the first electrode and the emission layer.
9. The organic light-emitting device of claim 1,
wherein at least one of a hole blocking layer, an electron transport layer, and an electron injection layer is interposed between the emission layer and the second electrode.
10. A bipolar phosphorescent material, comprising:
a material represented by formula 1:

where A is a hole transport unit, B is an electron transport unit, and C is a bond, or a linking group selected from the group consisting of oxygen atom, sulfur atom, and NH, wherein the hole transport unit A is

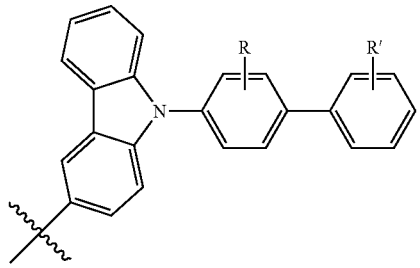

where each of R and R' is selected from a group consisting of H, a $C_1$-$C_{22}$ alkyl group, an alkoxy group, a CN group, a $NO_2$ group, and a —O—Ar group where Ar is selected from a group consisting of phenyl, biphenyl, 1-naphthyl, and 2-naphthyl; and X is selected from a group consisting of O, C—(R)$_2$, NR, S, and N=N, and
wherein the electron transport unit B is selected from the group of a fluorene unit, a spirofluorene unit, and an aluminum hydroquinoline unit represented by

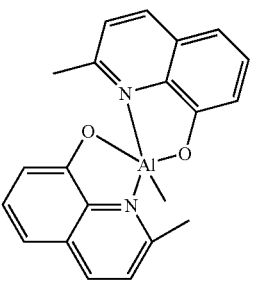

11. The bipolar phosphorescent material of claim 10,
wherein the bipolar phosphorescent material is represented by the following formula:

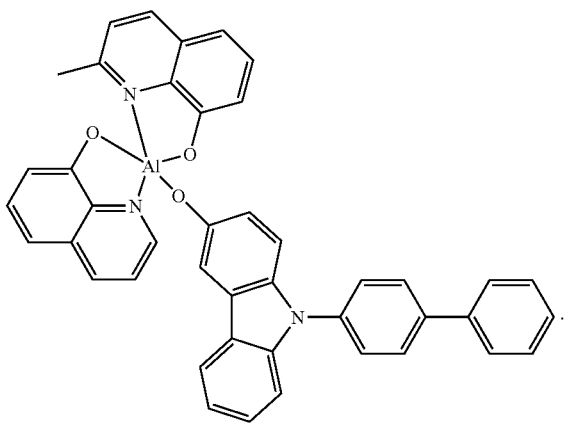

12. The organic light-emitting device of claim 1,
wherein the bipolar phosphorescent host is represented by the following formula:

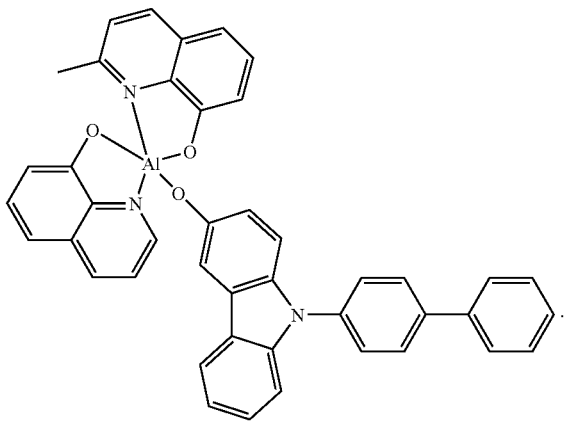

* * * * *

UNITED STATES PATENT AND TRADEMARK OFFICE
CERTIFICATE OF CORRECTION

PATENT NO. : 7,651,790 B2  Page 1 of 1
APPLICATION NO. : 11/266248
DATED : January 26, 2010
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 530 days.

Signed and Sealed this

Twenty-third Day of November, 2010

David J. Kappos
*Director of the United States Patent and Trademark Office*